(12) United States Patent
Kikuchi et al.

(10) Patent No.: US 10,658,188 B2
(45) Date of Patent: May 19, 2020

(54) METHOD OF MANUFACTURING A SEMICONDUCTOR DEVICE

(71) Applicant: SII Semiconductor Corporation, Chiba-shi, Chiba (JP)

(72) Inventors: Akihiro Kikuchi, Chiba (JP); Takeshi Kuroda, Chiba (JP); Shintaro Koseki, Chiba (JP)

(73) Assignee: ABLIC INC., Chiba (JP)

(*) Notice: Subject to any disclaimer, the term of this patent is extended or adjusted under 35 U.S.C. 154(b) by 48 days.

(21) Appl. No.: 15/814,999

(22) Filed: Nov. 16, 2017

(65) Prior Publication Data
US 2018/0166290 A1    Jun. 14, 2018

(30) Foreign Application Priority Data

Dec. 14, 2016  (JP) ................... 2016-241999

(51) Int. Cl.
| | | |
|---|---|---|
| H01L 21/30 | (2006.01) | |
| H01L 21/67 | (2006.01) | |
| H01L 21/3065 | (2006.01) | |
| C09K 13/00 | (2006.01) | |
| H01L 21/308 | (2006.01) | |
| H01J 37/32 | (2006.01) | |
| H05H 1/46 | (2006.01) | |
| C09K 13/08 | (2006.01) | |

(52) U.S. Cl.
CPC .......... *H01L 21/3065* (2013.01); *C09K 13/00* (2013.01); *C09K 13/08* (2013.01); *H01J 37/32192* (2013.01); *H01J 37/32678* (2013.01); *H01L 21/3086* (2013.01); *H01L 21/67069* (2013.01); *H05H 1/46* (2013.01)

(58) Field of Classification Search
CPC ............ H01L 21/3065; H01L 21/3086; H01L 21/67069
USPC ......................................................... 438/700
See application file for complete search history.

(56) References Cited

U.S. PATENT DOCUMENTS

| | | | | |
|---|---|---|---|---|
| 5,445,710 A | * | 8/1995 | Hori .................... | H01L 21/0332 438/717 |
| 6,461,974 B1 | * | 10/2002 | Ni ............................ | C23F 4/00 257/E21.252 |
| 8,753,902 B1 | * | 6/2014 | Liu ......................... | H01L 22/20 438/14 |
| 9,842,914 B1 | * | 12/2017 | Yeung ................. | H01L 29/6681 |
| 9,947,804 B1 | * | 4/2018 | Frougier ........... | H01L 29/78696 |
| 2003/0022512 A1 | * | 1/2003 | Saito ................. | H01J 37/32431 438/710 |
| 2003/0207579 A1 | * | 11/2003 | Rattner ............... | H01L 21/3065 438/700 |

(Continued)

FOREIGN PATENT DOCUMENTS

JP        2003-37100        2/2003

*Primary Examiner* — Sheikh Maruf
(74) *Attorney, Agent, or Firm* — Brinks Gilson & Lione

(57) ABSTRACT

Provided is a method of manufacturing a semiconductor device with which a trench shape having vertical, flat, and smooth side wall surfaces can be formed even at room temperature. A semiconductor substrate is placed on a sample stage which is kept at room temperature in a reaction container. A trench is formed in the semiconductor substrate by plasma etching that uses etching gas including oxygen and sulfur hexafluoride, while controlling the gas ratio of oxygen to sulfur hexafluoride so that the gas ratio is from 70% to 100%.

10 Claims, 10 Drawing Sheets

(56) References Cited

U.S. PATENT DOCUMENTS

| Publication No. | Date | Inventor | Classification | Subclass |
|---|---|---|---|---|
| 2004/0021062 A1* | 2/2004 | Zaidi | H01L 31/03528 | 250/214 R |
| 2004/0061238 A1* | 4/2004 | Sekine | H01L 21/76898 | 257/774 |
| 2005/0090927 A1* | 4/2005 | Tanaka | H01L 21/67276 | 700/121 |
| 2007/0048954 A1* | 3/2007 | Kato | H01J 37/32192 | 438/308 |
| 2008/0102639 A1* | 5/2008 | Cho | H01L 21/3065 | 438/702 |
| 2008/0105649 A1* | 5/2008 | Chandrachood | B82Y 10/00 | 216/47 |
| 2009/0221148 A1* | 9/2009 | Uda | H01L 21/3065 | 438/696 |
| 2010/0297848 A1* | 11/2010 | Breitwisch | H01L 21/32136 | 438/703 |
| 2012/0129278 A1* | 5/2012 | Yoshii | B81C 1/00087 | 438/14 |
| 2012/0205785 A1* | 8/2012 | Bouet | H01L 21/3065 | 257/632 |
| 2014/0001441 A1* | 1/2014 | Kim | H01L 29/0673 | 257/29 |
| 2014/0045338 A1* | 2/2014 | Tohnoe | H01L 21/3065 | 438/719 |
| 2014/0113450 A1* | 4/2014 | Uda | H01J 37/32449 | 438/694 |
| 2014/0273462 A1* | 9/2014 | Simsek-Ege | H01L 27/11578 | 438/696 |
| 2015/0093903 A1* | 4/2015 | Aoyama | C23C 16/18 | 438/703 |
| 2015/0318182 A1* | 11/2015 | Joseph | H01L 21/3086 | 438/714 |
| 2016/0137799 A1* | 5/2016 | Checco | B81C 1/00111 | 428/141 |
| 2016/0365411 A1* | 12/2016 | Yeh | H01L 29/0673 | |
| 2017/0141112 A1* | 5/2017 | Ching | H01L 27/0924 | |
| 2017/0183437 A1* | 6/2017 | Kato | C08F 2/50 | |

* cited by examiner

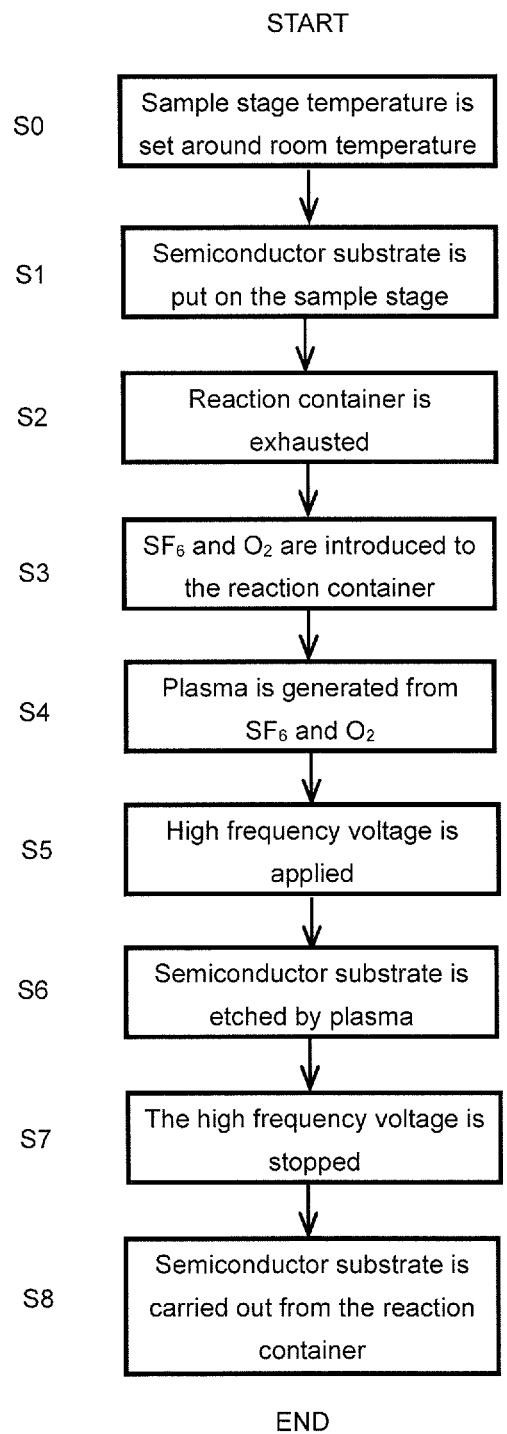

METHOD OF MANUFACTURING A SEMICONDUCTOR DEVICE

RELATED APPLICATIONS

This application claims priority under 35 U.S.C. § 119 to Japanese Patent Application No. 2016-241999 filed on Dec. 14, 2016, the entire content of which is hereby incorporated by reference.

BACKGROUND OF THE INVENTION

1. Field of the Invention

The present invention relates to a method of manufacturing a semiconductor device, in particular, to a method of manufacturing a semiconductor device having a trench.

2. Description of the Related Art

Silicon etching in which silicon as a constituent of a semiconductor substrate is etched is carried out in a manufacturing process of a semiconductor device to form a trench for isolating an element and a trench for a gate electrode in the semiconductor substrate. In the silicon etching, a plasma etching method has been proposed in which a silicon oxide film or a similar oxide film is used as a mask, the temperature of the semiconductor substrate is kept at −20° C., and oxygen or the like is added to sulfur hexafluoride serving as a main component of plasma etching gas (note, for example, Japanese Patent Application Laid-open No. 2003-37100).

However, in Japanese Patent Application Laid-open No. 2003-37100, since the substrate temperature (sample stage temperature) should be held at −20° C. which is far below 0° C., countermeasures against dew condensation needs to be taken in a cooling part in an etching machine and the flow path of a cooling medium. In addition, when the same etching machine has to operate under both the etching condition that the substrate is processed with the substrate temperature set around room temperature and the etching condition that the substrate is processed with the substrate temperature set at −20° C., a considerable time is needed until the temperature stabilizes. In another patent document, the substrate temperature is set even lower at −45° C. An example of the time required for the temperature to rise and fall between 15° C. and −45° C. is illustrated in FIG. 10. The temperature takes 4 hours to rise and approximately 10 hours to fall, which significantly limits the operation time of the etching machine, resulting in a marked drop in throughput. If the substrate temperature is set at room temperature in order to increase the operation time of the etching machine, while setting gas, pressure, and other conditions the same as those disclosed in Japanese Patent Application Laid-open No. 2003-37100, a desired trench shape is not obtained.

SUMMARY OF THE INVENTION

The present invention has been made in view of the above, and it is an object of the present invention therefore to provide a method of manufacturing a semiconductor device with which a desired trench shape can be obtained even at room temperature.

In order to achieve the purpose, the present invention uses the following measures.

First, according to one embodiment of the present invention, there is provided a method of manufacturing a semiconductor device in which a trench is formed in a semiconductor substrate, comprising:

forming a mask from inorganic substance on a front surface of the semiconductor substrate so that the mask has an opening in a portion in which the trench is to be formed;

controlling a temperature of a sample stage in a reaction container of an etching machine so as to keep the sample stage temperature constant;

putting the semiconductor substrate on the sample stage;

introducing etching gas including oxygen and sulfur hexafluoride to an interior of the reaction container while maintaining a flow rate ratio of oxygen to sulfur hexafluoride between 70% and 100%; and performing plasma etching of the semiconductor substrate with the etching gas to for iii the trench.

According to another embodiment of the present invention, there is provided a method of manufacturing a semiconductor device in which a trench is formed in a semiconductor substrate, comprising:

forming a mask from inorganic substance on a front surface of the semiconductor substrate so that the mask has an opening in a portion where the trench is to be formed;

controlling a temperature of a sample stage in a reaction container of an etching machine so as to keep the sample stage temperature constant;

putting the semiconductor substrate on the sample stage;

introducing etching gas including oxygen and sulfur hexafluoride to an interior of the reaction container while setting a flow rate ratio of oxygen to sulfur hexafluoride to a first ratio;

a first etching step of performing plasma etching of the semiconductor substrate with the etching gas at the first ratio;

introducing, after the first etching step, the etching gas including oxygen and sulfur hexafluoride to the interior of the reaction container while setting the flow rate ratio of oxygen to sulfur hexafluoride to a second ratio which is lower than the first ratio; and a second etching step of performing plasma etching of the semiconductor substrate with the etching gas at the second ratio.

According to another embodiment of the present invention, there is provided a method of manufacturing a semiconductor device in which a trench is formed in a semiconductor substrate, comprising:

forming a mask from inorganic substance on a front surface of the semiconductor substrate so that the mask has an opening in a portion in which the trench is to be formed;

controlling a temperature of a sample stage in a reaction container of an etching machine so as to keep the sample stage temperature constant;

putting the semiconductor substrate on the sample stage;

performing plasma etching by introducing etching gas including oxygen and sulfur hexafluoride to an interior of the reaction container while setting a flow rate ratio of oxygen to sulfur hexafluoride to a first ratio; and continuing plasma etching by introducing the etching gas to the interior of the reaction container while changing the flow rate ratio of oxygen to sulfur hexafluoride to a second ratio which is lower than the first ratio, in a single step instead of in stages.

Through use of the measures described above, it is possible to manufacture a semiconductor device in which a trench is shaped so as to have flat and smooth side wall surfaces substantially perpendicular in a thickness direction of a semiconductor substrate even when the substrate temperature is at room temperature.

BRIEF DESCRIPTION OF THE DRAWINGS

FIG. 3 is a flow chart of a first embodiment of a plasma etching method according to the present invention.

DETAILED DESCRIPTION OF THE PREFERRED EMBODIMENTS

Now, embodiments of the present invention are described with reference to the drawings.

Figure 1:
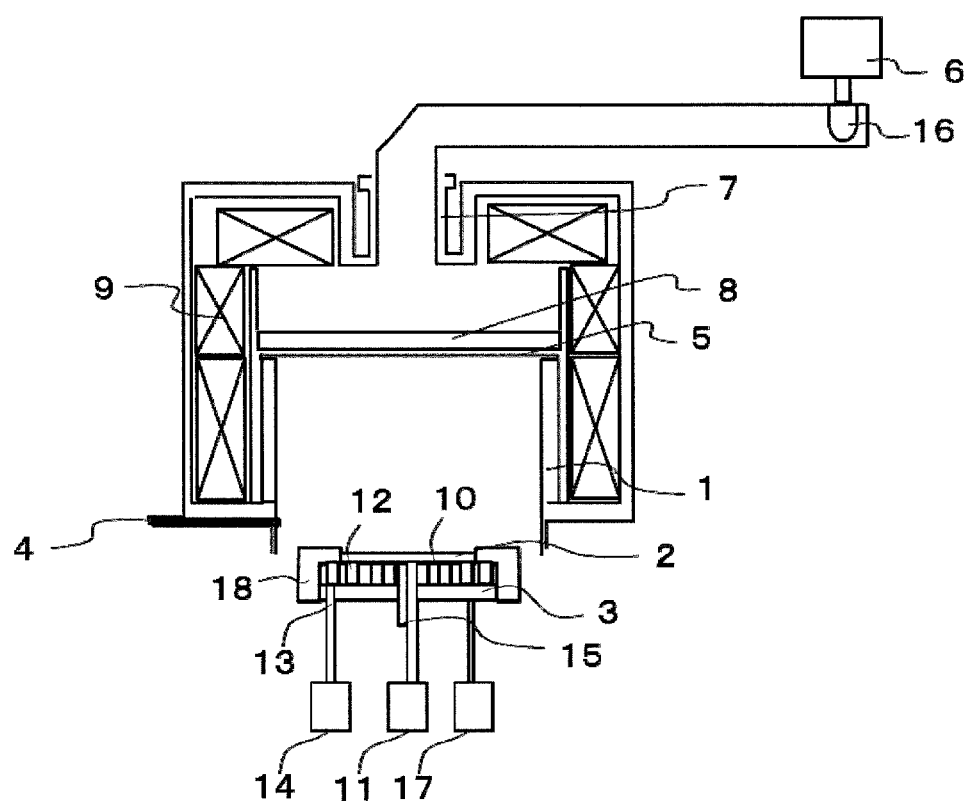
FIG. 1 is a schematic diagram of an etching machine used in plasma etching.

FIG. 1 is a schematic diagram of an etching machine to which an etching method according to the embodiment of the present invention is applied. This machine is an ECR microwave plasma etching machine which uses a microwave and a magnetic field.

The plasma etching machine includes a cylindrical reaction container 1 made of aluminum, stainless steel, or other materials. A conductive sample stage 3 on which a semiconductor substrate (silicon substrate or SOI substrate) 2 is placed is provided inside the reaction container 1. The sample stage is controlled so as to have a desired temperature by an external temperature fixing unit 14.

A gas flow rate adjuster (mass flow controller: MFC) (not shown) or an air valve (not shown) controls a flow rate and timing at which a gas used in etching is supplied. The gas is supplied evenly to a front surface of the semiconductor substrate 2 from a gas inlet 4 via a shower head plate 5 which is a transparent window having a porous structure.

A vacuum exhauster (not shown) that includes a turbo-molecular pump (TMP) is provided below the reaction container 1, and the interior of the reaction container 1 is kept at a given pressure by an auto-pressure controller (APC) or other pressure governors (omitted from the drawing). Processed reaction gas is exhausted to the outside of the reaction container 1 via the vacuum exhauster.

A microwave power source 6 and a microwave generator 16 generate a microwave that is introduced through a waveguide 7 to the reaction container 1 via a dielectric window 8 which is transmissive of electromagnetic waves and via the shower head plate 5. An electromagnet 9 for generating a magnetic field is placed on an outer peripheral wall of the reaction container 1. The plasma etching machine is structured to cause electron cyclotron resonance (ECR) through interaction between the magnetic field generated by the electromagnet 9 and the incident microwave, thereby forming high density plasma.

An electrostatic chuck 10 is provided on a surface of the conductive sample stage 3. A direct current voltage is applied by an electrostatic adsorption power source 17 to generate an electrostatic adsorption force with which the semiconductor substrate 2 is fixed to a surface of the electrostatic chuck 10. An insulating cover 18 made of ceramic or quartz is placed around the semiconductor substrate 2. The pieces provided at the center of the etching machine to form a structure on which the semiconductor substrate 2 is placed are collectively referred to as "electrode".

A groove is formed on the surface of the electrostatic chuck 10 as a structure through which He or a similar inert gas is supplied from a constant temperature gas supply port 15 to a constant temperature gas flow path 12 which is formed between a rear surface of the fixed semiconductor substrate 2 and the electrostatic chuck 10 so that the interior of the flow path 12 is maintained at a given pressure. A medium of which the temperature is controlled by the temperature fixing unit 14 (for example, chiller unit) is circulating in a constant temperature circulatory flow path 13 which is embedded in the sample stage 3, and the temperature of the semiconductor substrate 2 is kept constant by heat conduction through gas in the constant temperature gas flow path 12 and heat conduction through a contacting surface.

A high frequency power source 11 is connected to the conductive sample stage 3 so that a sine wave voltage having a frequency of 13.56 MHz can be applied.

In short, the etching machine includes the reaction container 1, the electrode (sample stage) 3 which is provided inside the reaction container 1 and on which a silicon substrate or an SIO substrate is placed, the microwave power source (magnetron) 6 for generating plasma, the electromagnet 9 provided on the outer peripheral wall of the reaction container 1 to generate a magnetic field, the process gas inlet 4 through which a mixture gas of fluorine-containing gas and oxygen gas is supplied to the interior of the reaction container 1, a unit configured to keep constant the temperature of the silicon or SOI substrate put on the electrode 3 (the unit is made up of the constant temperature gas flow path 12, the constant temperature circulatory flow path 13, and the temperature fixing unit 14), and the high frequency power source 11 configured to supply a high frequency bias to the electrode 3, and the etching machine is configured to form a groove and/or a hole in the silicon or SOI semiconductor substrate 2. The mixture gas of fluorine-containing gas and oxygen gas is supplied from the process gas inlet 4 while the temperature of the mixture gas is kept constant at the same temperature as the sample stage temperature. This helps to control the temperature of the sample stage 3 on which the semiconductor substrate 2 is placed.

Figure 2:
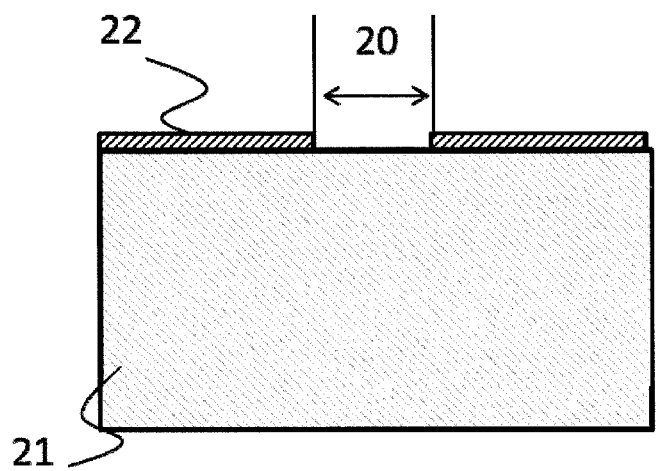
FIG. 2 is a sectional view of a semiconductor substrate used in plasma etching.

Next, with reference to FIG. 1 to FIG. 3, description is made of a plasma etching procedure of a semiconductor substrate in the first embodiment for method of manufacturing a semiconductor device according to the present invention.

First, the temperature fixing unit 14 illustrated in FIG. 1 is put into operation to bring the temperature of the sample stage 3 to a predetermined temperature which is around room temperature. In the first embodiment, the predetermined temperature of the sample stage 3 is 15° C. which is not different from the predetermined temperature in other etching conditions, for example, a condition for polysilicon etching, and accordingly does not require a long waiting time when etching conditions are switched. Another advantage of choosing a predetermined temperature that is not a low temperature is that there is no need to take countermeasures against dew condensation along the flow path to the temperature fixing unit 14.

Meanwhile, the semiconductor substrate 2 illustrated in FIG. 2 is prepared by forming a trench processing-use mask 22 on a silicon substrate 21. The mask 22 is obtained by forming a silicon oxide ($SiO_2$) film on the entire trench processing surface (upper surface in FIG. 2) of the silicon substrate 21, and then creating a mask opening region 20 which is shaped so as to match the necessary shape in plan view of a trench. Other than a silicon oxide film, a silicon nitride film, a silicon oxynitride film, or a composite film of a silicon nitride film and a silicon oxynitride film is used as the mask material. A resist used to form the mask 22 is removed and a hard mask made solely of inorganic substance is used here, which helps to stabilize trench etching. The thickness of the mask 22 is determined suitably from the etch selectivity of the silicon oxide film that is the mask material and the silicon substrate.

The plasma etching procedure in the first embodiment is described below with reference to a flow chart of FIG. 3.

First, the sample stage temperature in the reaction container 1 is brought to a desired predetermined temperature that is around room temperature (Step S0). Next, the semiconductor substrate 2 on which the mask 22 has been formed is carried into the reaction container 1 and put on the sample stage 3 of which the temperature has been controlled (Step S1). The reaction container 1 is next exhausted by the vacuum pump device to create a vacuum space (Step S2). The etching gas which is a mixture of $SF_6$ and $O_2$ is then introduced to the interior of the reaction container 1 (Step S3). While the interior of the reaction container 1 is kept at a given pressure, for example, 2.5 Pa, the microwave power source 6 and the electromagnet 9 are activated to generate plasma (Step S4).

A high frequency voltage is further applied to the sample stage 3 from the high frequency power source 11 (Step S5). Ions that have the plasma of the etching gas as an ion source are thus accelerated by a high frequency electric field, to enter the semiconductor substrate 2 at a high speed. Plasma etching of the semiconductor substrate 2 is started as a result and, with the progress of the etching processing, a trench is formed in the semiconductor substrate 2 (Step S6). After a given length of time elapses, the application of the high frequency voltage, the microwave introduction, and the magnetic field application are stopped to end the etching processing (Step S7).

The given length of time is the time required until the etching reaches a desired depth, and can be set in advance to a time figured out from calculation, test etching, or the like. A semiconductor device is made up of transistors, resistors, and various other elements, and a method of manufacturing the semiconductor device includes various semiconductor steps in addition to the plasma etching described above.

Figure 4A:
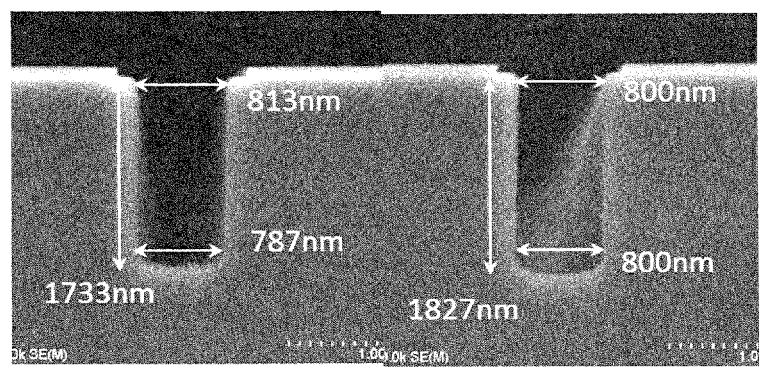
FIG. 4A and FIG. 4B are sectional views of a sample that is etched by the first embodiment of the plasma etching method according to the present invention.

Thereafter, the reaction container 1 is exhausted of the etching gas and the semiconductor substrate 2 is then carried out of the reaction container 1 (Step S8). In the obtained semiconductor substrate 2, a trench having a substantially ideal shape and a desired depth is formed. An example of the ideally shaped trench is illustrated in FIG. 4A in which the trench has side wall surfaces that are vertical, flat, and smooth, and a semicircular bottom surface. A photograph on the left side of FIG. 4A is a sectional view of a sample in a central part of the wafer, and a photograph on the right side is a sectional view of the sample in a peripheral part of the wafer.

Etching parameters used for the photographed sample are as follows:

Etching gas: $SF_6$ (sulfur hexafluoride)+$O_2$ (oxygen)
Gas flow rate: $SF_6$→40 sccm, $O_2$→30 sccm
Gas ratio: $O_2/SF_6$ ratio=3/4=75%
Gas pressure: 2.5 Pa
Sample stage temperature: 15° C.
Etching characteristics in this case are as follows:
Etching rate: 2.6 μm/min. (the lowest value)
Etch selectivity: 20 (the lowest value)

The etch selectivity means the etch selectivity of silicon with respect to an oxide film, and is the etching rate ratio of silicon that is the substrate material to the silicon oxide film that is the mask material.

The shape of the trench obtained under the conditions given above is as follows:

Trench shape: side wall surfaces that are vertical (within a tilt angle of) 1°), flat, and smooth, and a rounded bottom surface
Trench width: 0.8 μm
Trench depth: 1.8 μm
Aspect ratio: 2.25

Figure 4B:
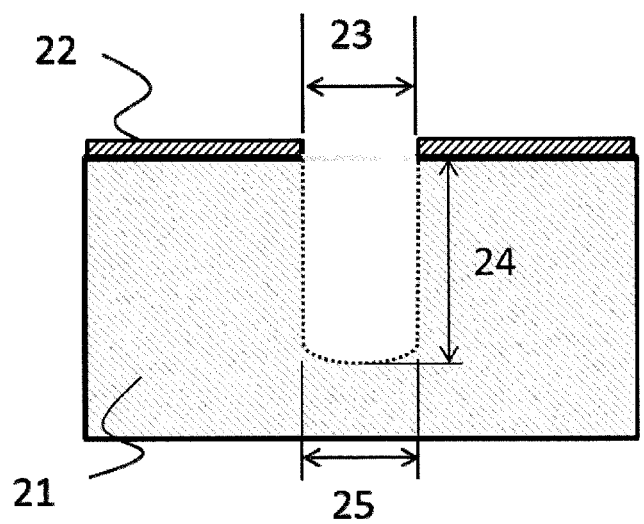

A trench width 23 and a trench depth 24 are defined as a width at an upper end of the trench and a depth to the lowest point in the trench, respectively, and are as illustrated in FIG. 4B.

In the first embodiment, the sample stage temperature is 15° C. and the etching gas is made up solely of $O_2$ gas and $SF_6$ gas. There is no fear that a component having a low vapor pressure, for example, SiCl or SiBr, may be generated, and a high etching rate is obtained with ease. Since the $O_2/SF_6$ gas ratio can be set properly, occurrence of bowing and side etching are suppressed, and results in appropriate anisotropic etching. A high etching rate, 2.6 μm/min at the lowest, is accordingly achieved without fail, and the achieved etch selectivity also has as high a value as 20.

In addition, since the substrate temperature is relatively high in this etching which is performed at room temperature as opposed to etching in the related art in which a low-temperature environment is used, physical adsorption of a reaction product to the semiconductor substrate is reduced, thereby improving the yield greatly without contaminating the semiconductor substrate. Through use of the first embodiment, a desired trench shape can be obtained as described above under easy-to-handle etching conditions that include setting of the substrate temperature at room temperature and using a single step for a binary etching gas system.

The sample stage temperature which is 15° C. in the first embodiment can be set to 10° C. to 20° C. in order to obtain the same result. A favorable result is obtained when the sample stage temperature is within a range of from 5° C. to 30° C.

Figure 5A:
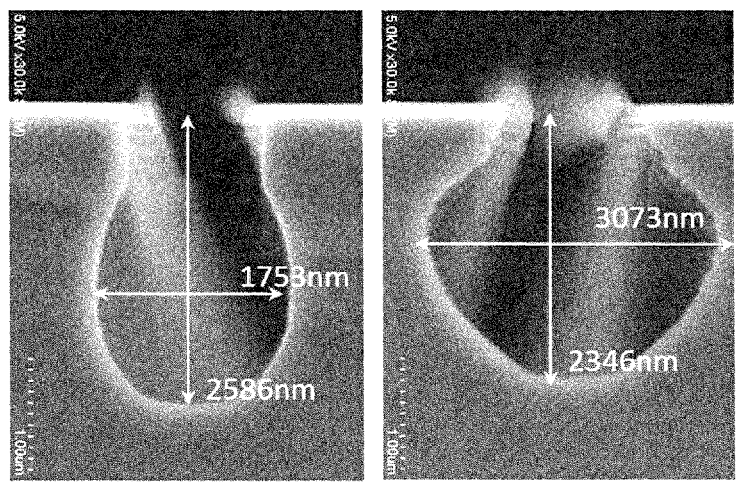
FIG. 5A and FIG. 5B are sectional views of a sample that is etched by plasma etching at room temperature.
Figure 5B:
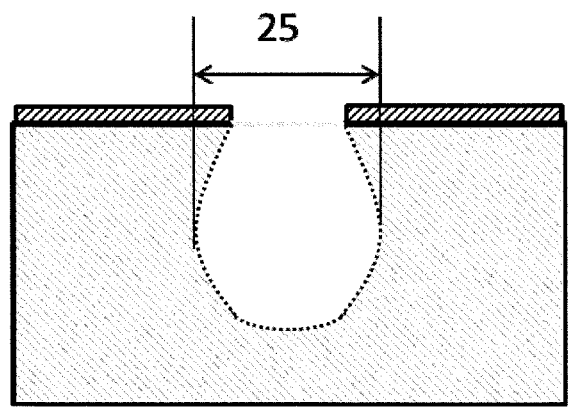

A trench shape that is obtained when the etching gas flow rate ratio is changed is illustrated in FIG. 5A and FIG. 5B as a comparative example. Other conditions than the etching gas flow rate ratio, for example, the substrate temperature, are the same as the etching conditions in this embodiment. A photograph on the left side of FIG. 5A is of a central part of the wafer, and a photograph on the right side is of a peripheral part of the wafer. A schematic diagram of the trench is illustrated in FIG. 5B.

In the comparative example in which the $O_2/SF_6$ ratio is 2:3 (66.7%) to set the ratio of $SF_6$ higher than in the etching condition of the embodiment a phenomenon in which a central part of the trench swells out (bowing) has occurred as illustrated in FIG. 5A and FIG. 5B, and the tendency is prominent in the peripheral part of the wafer. A bowing width 25 indicates the maximum value of the swelling of the trench.

While the $SF_6$ gas acts to etch silicon, the $O_2$ gas acts to check the etching rate of the silicon oxide film that is the mask material, acts to form a protective film on a surface of the silicon oxide film that is the mask material by oxidizing silicon and silicon fluoride that are reaction products, and acts to form protective films by oxidizing silicon surfaces on inner wall surfaces of the etched trench. In the comparative example in which the bowing has occurred, the ratio of $O_2$ is lower than in the etching conditions of the first embodiment of the present invention, and it is surmised that a failure to form a protective film capable of withstanding etching due to the low $O_2$ ratio has made the trench shape swollen in the central part of the trench.

Figure 6:
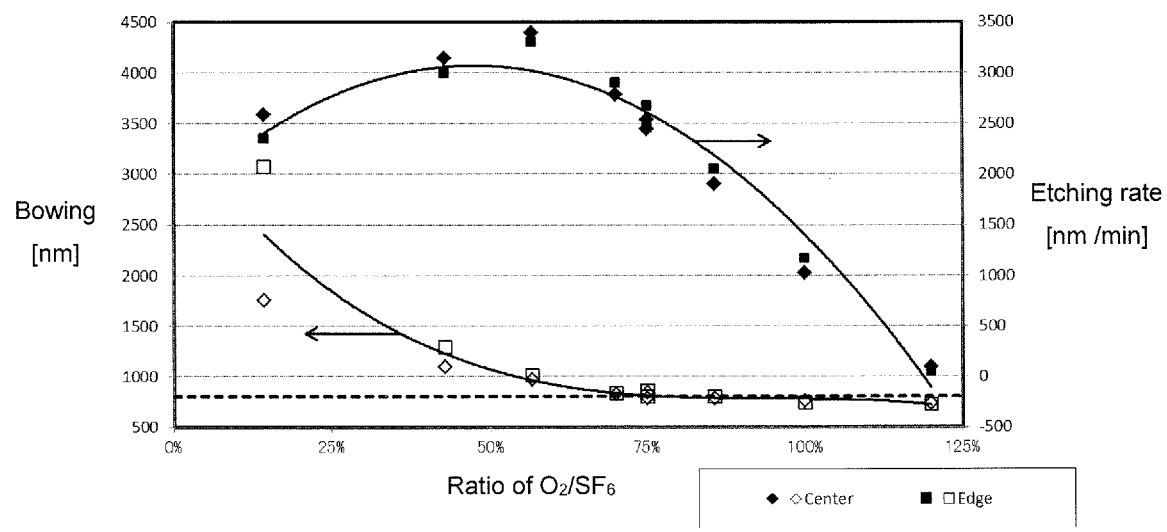
FIG. 6 is a graph for showing bowing and the etching rate in the first embodiment of the plasma etching method according to the present invention.

FIG. 6 is an example of a graph for showing the flow rate ratio of $SF_6$ and $O_2$, bowing characteristics, and etching rate characteristics in the first embodiment. The horizontal axis of the graph represents the $O_2/SF_6$ gas ratio, the vertical axis on the left side represents the bowing width which indicates the swelling of the trench, and the vertical axis on the right side represents the trench etching rate (etching speed) to indicate bowing widths and etching rates at the center of the semiconductor substrate and along the edges of the semiconductor substrate. A white diamond represents the bowing width at the center of the semiconductor substrate, and a black diamond represents the etching rate at the center of the semiconductor substrate. A white square represents the bowing width along the edges of the semiconductor substrate, and a black square represents the etching rate along the edges of the semiconductor substrate. A horizontal line parallel to the horizontal axis that intersects with a 800 nm mark on the left vertical axis represents the width of a trench that has no bowing, and being plotted on this line is one of necessary conditions to be fulfilled for a trench to have a vertical shape.

Bowing is defined as indicated by the bowing width 25 in FIG. 4B and FIG. 5B. The maximum trench width is measured as the bowing width when there is bowing and, when there is no bowing, the trench width right above the rounded bottom portion of the trench is measured as the bowing width. In the first embodiment of the present invention in which using $SF_6+O_2$ gas as etching gas and setting the sample temperature to 5° C. to 30° C. are requirements bowing can be prevented and a proper etching rate can be obtained when the $O_2/SF_6$ ratio is within a range of from 70% to 100%. A trench shape without bowing can be obtained also when the $O_2/SF_6$ ratio is equal to or higher than 100%, the etching rate drops. At an $O_2/SF_6$ ratio of 125%, etching stops and practical running of the etching machine is not possible. The trench shape described above with reference to FIG. 4A and FIG. 4B is an example of the trench shape within a proper range in the first embodiment. In contrast, a trench assumes a marked bowing shape as in FIG. 5A and FIG. 5B when the gas ratio is less than 60%. A favorable effect can be obtained in the first embodiment when the sample stage temperature is from 5° C. to 30° C.

Figure 7:
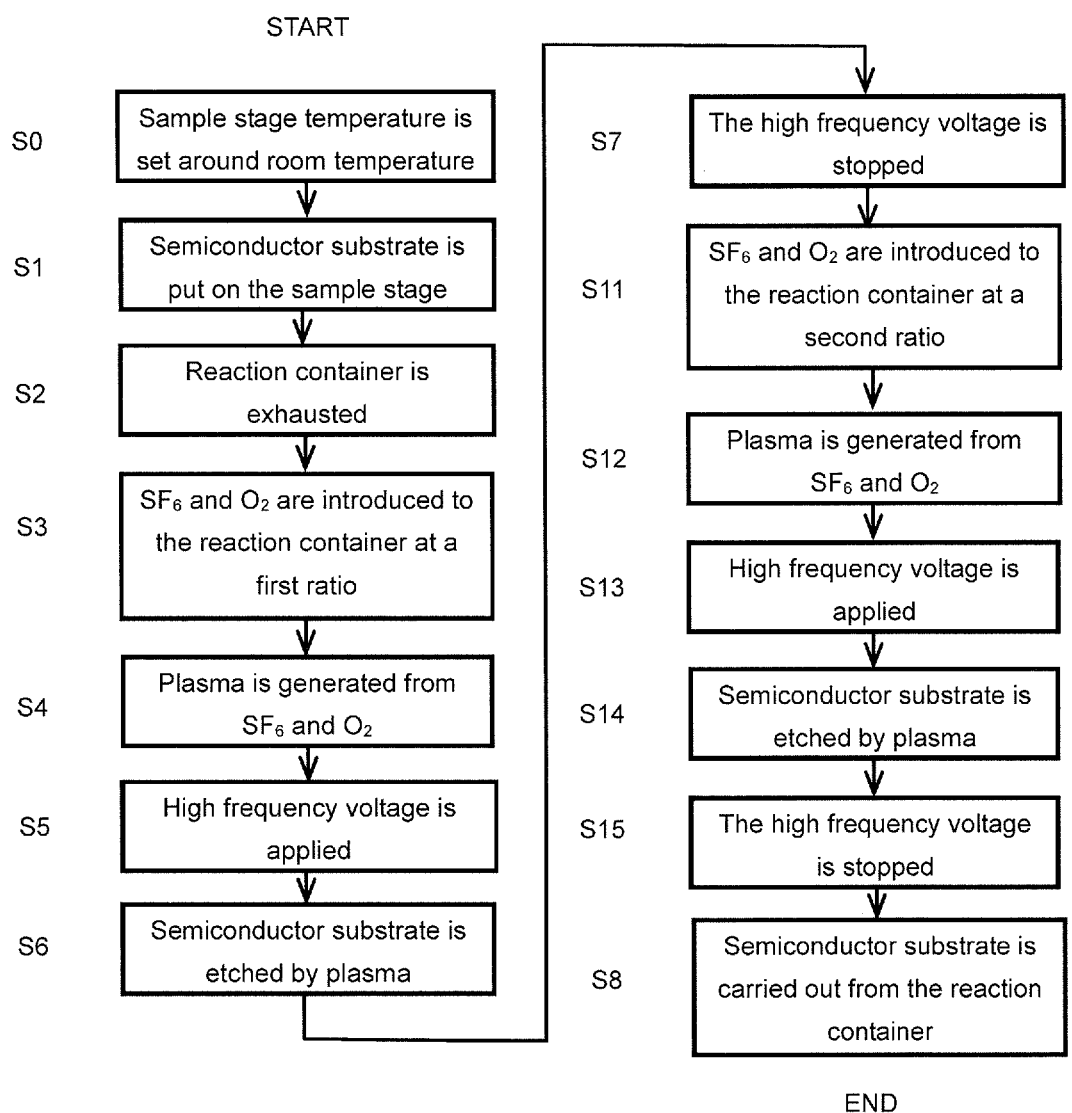
FIG. 7 is a flow chart of a second embodiment of the plasma etching method according to the present invention.

FIG. 7 is a flow chart of a plasma etching procedure in the second embodiment for method of manufacturing a semiconductor device according to the present invention.

Trench etching in the first embodiment is performed by introducing the etching gas to the reaction container 1 at an arbitrary $O_2/SF_6$ ratio within a range of from 70% to 100%.

Trench etching in the second embodiment is performed by first conducting trench etching at a first arbitrary $O_2/SF_6$ ratio within a range of from 70% to 100%, and then conducting etching at a second arbitrary $O_2/SF_6$ ratio within a range of from 70% to 100%. The first ratio is set higher than the second ratio. For example, the semiconductor substrate is etched by conducting etching for a given length of time with the first $O_2/SF_6$ ratio set to 100% (Steps S3 to S6), and then changing the gas flow rate ratio to conduct etching with the second $O_2/SF_6$ ratio set to 70% (Steps S11 to S14). Only two types of gas, $O_2$ and $SF_6$, are used as etching gas in this embodiment.

To give a specific example, the gas flow rate at the first $O_2/SF_6$ ratio that is 100% is $O_2:SF_6=1:1$, and the gas flow rate at the second $O_2/SF_6$ ratio that is 75% is $O_2:SF_6=3:4$. The first $O_2/SF_6$ ratio and the second $O_2/SF_6$ ratio are also set so that the sum of the gas flow rates is the same. Through setting of the same gas flow rate sum for the first $O_2/SF_6$ ratio and for the second $O_2/SF_6$ ratio in this manner, the pressure in the reaction container 1 can be kept constant, which prevents the flapping of the auto-pressure controller (APC) or other pressure governors and leads to stable etching.

At the first $O_2/SF_6$ ratio, etching that is high in oxygen concentration and in anisotropy can be expected. At the second $O_2/SF_6$ ratio, the oxygen concentration is lower than at the first $O_2/SF_6$ ratio, and etching that has a high etching rate in the depth direction of the trench and that is small in residue is accordingly accomplished. Conducting etching at the first $O_2/SF_6$ ratio and then conducting etching at the second $O_2/SF_6$ ratio in this manner yields a trench that is shaped so as to have vertical, flat, and smooth side wall surfaces and a rounded bottom surface, and that is free of residue.

To give a detailed description, the etching is conducted by the following procedure.

First, the sample stage temperature in the reaction container 1 is brought to a desired predetermined temperature that is around room temperature (Step S0). Next, the semiconductor substrate 2 is carried into the reaction container 1 and put on the sample stage 3 of which the temperature has been controlled (Step S1). The reaction container 1 is next exhausted by the vacuum pump device to create a vacuum space (Step S2). The etching gas which is a mixture of $SF_6$ and $O_2$ is then introduced to the interior of the reaction container 1 at the first $O_2/SF_6$ ratio (Step S3). While the interior of the reaction container 1 is kept at a given pressure, for example, 2.5 Pa, the microwave power source 6 and the electromagnet 9 are activated to generate plasma (Step S4).

A high frequency voltage is further applied to the sample stage 3 from the high frequency power source 11 (Step S5). Ions that have the plasma of the etching gas as an ion source are thus accelerated by a high frequency electric field, to enter the semiconductor substrate 2 at a high speed. The semiconductor substrate 2 is etched by plasm etching as a result (Step S6). After a given length of time elapses, the application of the high frequency voltage is stopped (Step S7).

Next, the etching gas which is a mixture of $SF_6$ and $O_2$ is introduced to the interior of the reaction container 1 at the second $O_2/SF_6$ ratio (Step S11). While the interior of the reaction container 1 is kept at a given pressure, for example, 2.5 Pa, the microwave power source 6 and the electromagnet 9 are activated to generate plasma (Step S12). A high frequency voltage is further applied to the sample stage 3 from the high frequency power source 11 (Step S13). Ions that have the plasma of the etching gas as an ion source are thus accelerated by a high frequency electric field, to enter the semiconductor substrate 2 at a high speed. A trench is formed in the semiconductor substrate 2 as a result (Step S14).

After a given length of time elapses, the application of the high frequency voltage, the microwave introduction, and the magnetic field application are stopped to end the etching processing (Step S15). The semiconductor substrate 2 is then carried out of the reaction container 1 (Step S8).

Figure 8A:
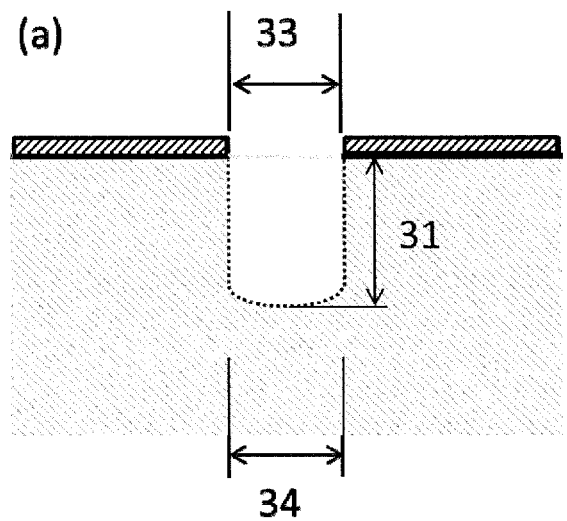
FIG. 8A and FIG. 8B are sectional views of a sample that is etched by the second embodiment of the plasma etching method according to the present invention.
Figure 8B:
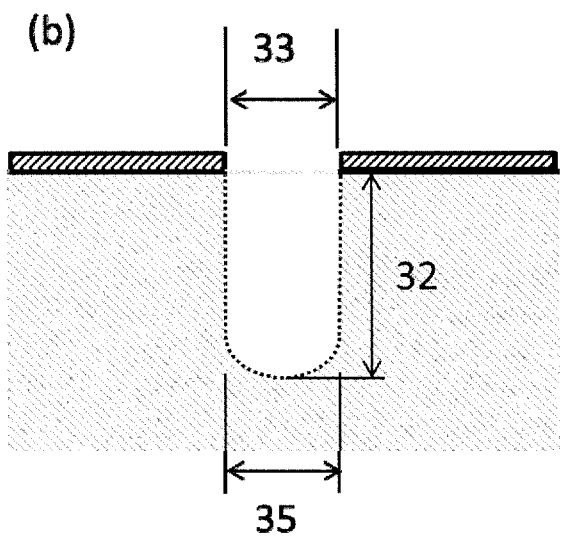

FIG. 8A and FIG. 8B are schematic diagrams of a sample in section that is processed by the second embodiment. Etching at the first $O_2/SF_6$ ratio forms a trench that has a trench depth 31 and a trench width 33 as illustrated in FIG. 8A. Further, conducting etching at the second $O_2/SF_6$ ratio forms a trench having a trench depth 32 and the trench width 33 as illustrated in FIG. 8B. The formed trench has vertical side wall surfaces and bowing widths 34 and 35 that are substantially the same as the trench width 33.

The rounded bottom surface formed after the etching at the second $O_2/SF_6$ ratio has a relatively large curvature than in the etching at the first $O_2/SF_6$ ratio. The trench depth 31 in the etching at the first $O_2/SF_6$ ratio is desirably from 80% to 99% of the final trench depth 32, while the remaining 20% to 1% of the trench depth 32 is etched in the etching at the second $O_2/SF_6$ ratio. More desirably, the trench depth 31 in the etching at the first $O_2/SF_6$ ratio is from 90% to 99% of the final trench depth 32, while the remaining 10% to 1% of the trench depth 32 is etched in the etching at the second $O_2/SF_6$ ratio.

Etching at the first $O_2/SF_6$ ratio and etching at the second $O_2/SF_6$ ratio are used in the example described above. However, a third $O_2/SF_6$ ratio, a fourth $O_2/SF_6$ ratio, and more may be set. The $O_2/SF_6$ ratio in this case is set smaller in a step that follows than in a preceding step. The sum of gas flow rates is desirably constant, but different flow rate sums may be used.

Figure 9:
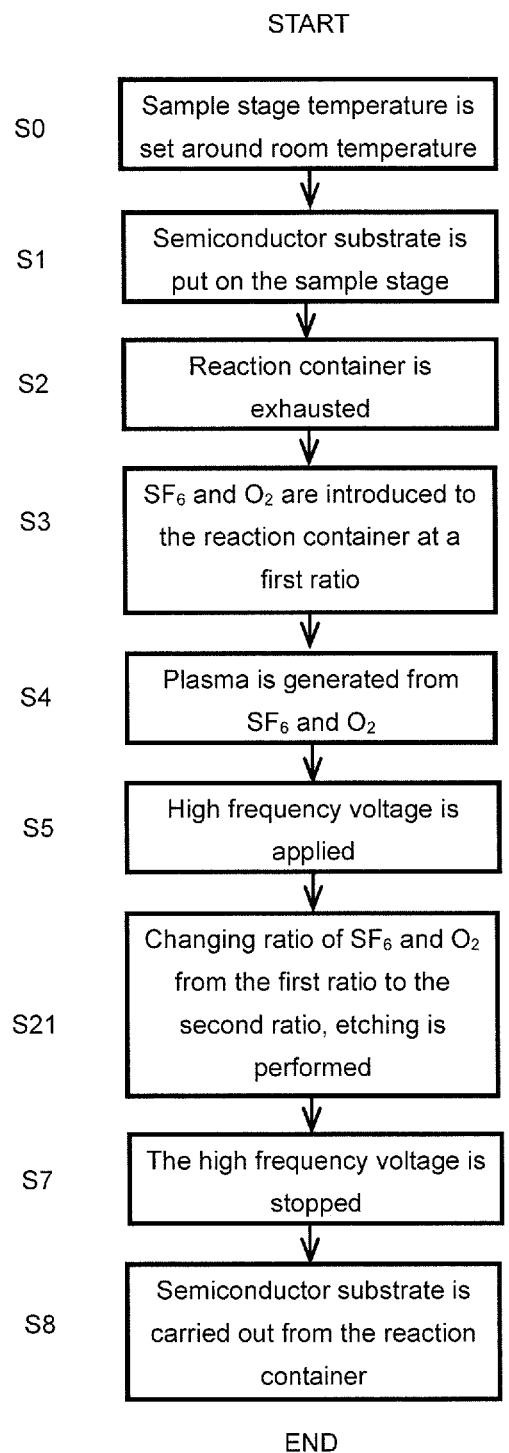
FIG. 9 is a flow chart of a third embodiment of a plasma etching method according to the present invention.
Figure 10:
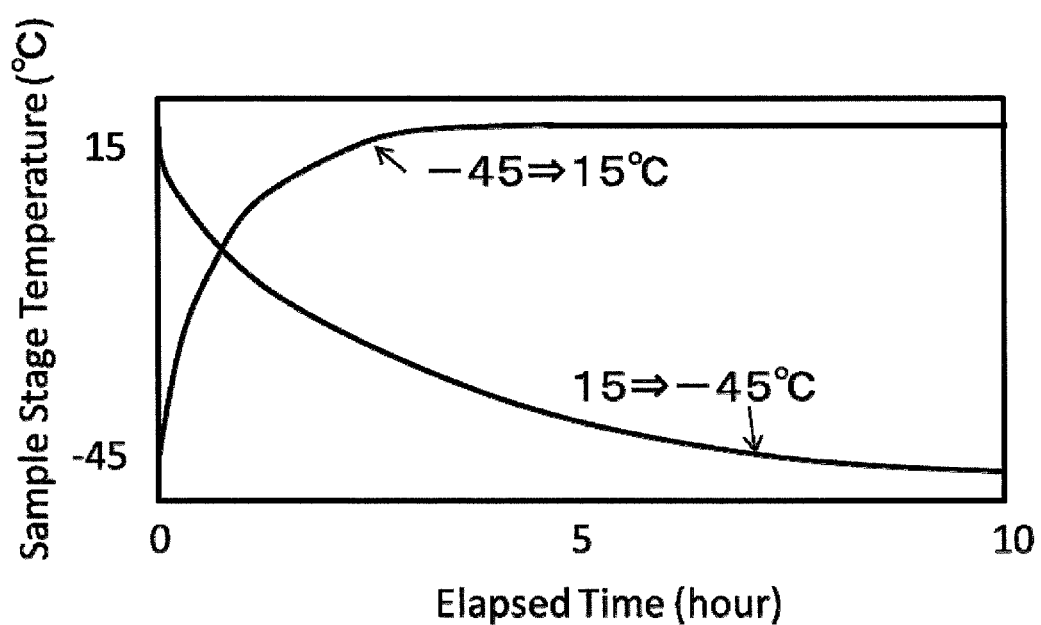
FIG. 10 is data about temperature stability that is observed when the sample stage temperature is raised and dropped.

First $O_2/SF_6$ ratio>second $O_2/SF_6$ ratio>third $O_2/SF_6$ ratio>fourth $O_2/SF_6$ ratio> . . . >Final $O_2/SF_6$ ratio FIG. 9 is a flow chart of a plasma etching procedure in the third embodiment according to the present invention.

Trench etching in the second embodiment uses etching gas at the first $O_2/SF_6$ ratio and the second $O_2/SF_6$ ratio that are arbitrary ratios within a range of from 70% to 100%. The third embodiment is an etching method in which the gas ratio is changed during etching from the first $O_2/SF_6$ ratio to the second $O_2/SF_6$ ratio continuously in a single step, instead of in stages.

First, the sample stage temperature in the reaction container 1 is brought to a desired predetermined temperature that is around room temperature (Step S0). Next, the semiconductor substrate 2 is carried into the reaction container 1 and put on the sample stage 3 of which the temperature has been controlled (Step S1). The reaction container 1 is next exhausted by the vacuum pump device to create a vacuum space (Step S2). The etching gas which is a mixture of $SF_6$ and $O_2$ is then introduced to the interior of the reaction container 1 at the first $O_2/SF_6$ ratio (Step S3). While the interior of the reaction container 1 is kept at a given pressure, for example, 2.5 Pa, the microwave power source 6 and the electromagnet 9 are activated to generate plasma (Step S4).

A high frequency voltage is further applied to the sample stage 3 from the high frequency power source 11 (Step S5). Ions that have the plasma of the etching gas as an ion source are thus accelerated by a high frequency electric field, to enter the semiconductor substrate 2 at a high speed. As a result, the etching of the semiconductor substrate 2 by plasm etching is started (Step S6).

The etching processing is conducted while changing the etching gas mixing ratio to the second $O_2/SF_6$ ratio in a single step instead of in stages, without fixing the etching gas mixing ratio to any particular ratio (Step S21) to form a trench in the semiconductor substrate 2 (Step S6). After a given length of time elapses, the application of the high frequency voltage, the microwave introduction, and the magnetic field application are stopped to end the etching processing (Step S7). The semiconductor substrate 2 is then carried out of the reaction container 1 (Step S8).

According to the third embodiment, the stopping and starting of high frequency voltage application that accompanies the switch of the etching gas ratio is conducted less frequently than in the second embodiment. This shortens the etching time and also helps to form a trench stably.

Etching gas in the first to third embodiments of the present invention is not limited to the $SF_6+O_2$ gas described above and, as long as the main component of etching gas is the $SF_6+O_2$ gas, $Cl_2$ (chlorine) can be added in order to use an $SF_6+O_2+Cl_2$ gas, or HBr can be added in order to use an $SF_6+O_2+HBr$ gas, or $SiF_4$ can be added in order to use an $SF_6+O_2+SiF_4$ gas, or $NF_3$ can be added in order to use an $SF_6+O_2+NF_3$ gas, or one or more rare gases out of He, Ne, Ar, Kr, and Xe may be mixed with the $SF_6+O_2$ gas.

The set conditions of the embodiments can be used not only in processing under a single etching condition, but also when processing under a different etching condition is inserted before or after the processing under a single etching condition.

The description given above on the present invention uses a few embodiments having plasma etching procedures. However, the present invention is applicable irrespective of how plasma is generated, and the same effects can therefore be obtained when the present invention is carried out in, for example, a parallel plate RIE device, a helicon etching machine, or an inductively coupled etching machine.

What is claimed is:

1. A method of manufacturing a semiconductor device in which a trench is formed on a semiconductor substrate, comprising:

forming a mask of an inorganic substance on a front surface of a semiconductor substrate so that the mask has an opening in a portion in which a trench is formed;

controlling a temperature of a sample stage in a reaction container of an etching machine so as to keep the sample stage at constant predetermined temperature of 5° C. to 30° C.;

putting the semiconductor substrate on the sample stage;

introducing an etching gas including oxygen and sulfur hexafluoride to an interior of the reaction container while maintaining a flow rate ratio of oxygen to sulfur hexafluoride between 70% and 100%; and performing plasma etching of the semiconductor substrate with the etching gas to form the trench, while maintaining the constant predetermined temperature.

2. A method of manufacturing a semiconductor device in which a trench is formed in a semiconductor substrate, comprising:

forming a mask from an inorganic substance on a front surface of a semiconductor substrate so that the mask has an opening in a portion in which the trench is formed;

controlling a temperature of a sample stage in a reaction container of an etching machine so as to keep the sample stage at a constant predetermined temperature of 5° C. to 30° C.;

putting the semiconductor substrate on the sample stage;

introducing an etching gas including oxygen and sulfur hexafluoride to an interior of the reaction container while setting a flow rate ratio of oxygen to sulfur hexafluoride to a first ratio;

a first etching step of performing plasma etching on the semiconductor substrate with the etching gas at the first ratio, while maintaining the constant predetermined temperature;

after the first etching step, introducing the etching gas including oxygen and sulfur hexafluoride into the interior of the reaction container while setting the flow rate ratio of oxygen to sulfur hexafluoride to a second ratio that is lower than the first ratio, wherein the first ratio and the second ratio have an oxygen to sulfur hexafluoride ratio between 70% and 100%; and a second etching step of performing plasma etching on the semiconductor substrate with the etching gas at the second ratio, while maintaining the constant predetermined temperature.

3. A method of manufacturing a semiconductor device in which a trench is formed in a semiconductor substrate, comprising:

forming a mask from an inorganic substance on a front surface of a semiconductor substrate so that the mask has an opening in a portion in which the trench is formed;

controlling a temperature of a sample stage in a reaction container of an etching machine so as to keep the sample stage at a constant predetermined temperature of 5° C. to 30° C.;

putting the semiconductor substrate on the sample stage;

performing plasma etching by introducing an etching gas including oxygen and sulfur hexafluoride into an interior of the reaction container while setting a flow rate ratio of oxygen to sulfur hexafluoride to a first ratio; and continuing the plasma etching by introducing the etching gas to the interior of the reaction container while changing the flow rate ratio of oxygen to sulfur hexafluoride to a second ratio that is lower than the first ratio in a single step instead of in stages, while maintaining the constant predetermined temperature wherein the first ratio and the second ratio have an oxygen to sulfur hexafluoride ratio between 70% and 100%.

4. A method of manufacturing a semiconductor device according to claim 1, wherein a sum of flow rates of the etching gas is constant.

5. A method of manufacturing a semiconductor device according to claim 1, wherein the etching gas including oxygen and sulfur hexafluoride comprises only oxygen and sulfur hexafluoride.

6. A method of manufacturing a semiconductor device according to claim 2, wherein the etching gas including oxygen and sulfur hexafluoride comprises only oxygen and sulfur hexafluoride.

7. A method of manufacturing a semiconductor device according to claim 3, wherein the etching gas including oxygen and sulfur hexafluoride comprises only oxygen and sulfur hexafluoride.

8. A method of manufacturing a semiconductor device according to claim 4, wherein the etching gas including oxygen and sulfur hexafluoride comprises only oxygen and sulfur hexafluoride.

9. A method of manufacturing a semiconductor device according to claim 2, wherein a sum of flow rates of the etching gas at the first ratio and a sum of flow rates of the etching gas at the second ratio are the same.

10. A method of manufacturing a semiconductor device according to claim 3, wherein a sum of flow rates of the etching gas at the first ratio and a sum of flow rates of the etching gas at the second ratio are the same.

* * * * *